United States Patent

[11] 3,593,677

[72] Inventor John H. McLain
Huntsville, Ala.

[21] Appl. No. 681,615
[22] Filed Nov. 9, 1967
[45] Patented July 20, 1971

[73] Assignee Brown Engineering Company
Huntsville, Ala.

[54] SOLDERING APPARATUS AND METHOD
12 Claims, 4 Drawing Figs.

[52] U.S. Cl. .......... 118/206, 117/68, 219/421
[51] Int. Cl. .......... B23k 3/06, H05k 3/34
[50] Field of Search .......... 118/206, 202, 217, 221, 225, 222, 226, 324, 407, 410, 415, 412; 228/35, 36, 40, 53; 117/114, 111, 68, 51, 112; 219/227, 229, 231, 421

[56] References Cited

UNITED STATES PATENTS

| | | | |
|---|---|---|---|
| 1,238,671 | 8/1917 | Holcomb | 219/229 X |
| 3,029,766 | 4/1962 | Jones | 228/33 |
| 3,053,215 | 9/1962 | Guty | 118/412 X |
| 3,216,642 | 11/1965 | DeVerter | 118/410 X |
| 2,371,170 | 3/1945 | Hill | 118/202 X |
| 2,771,852 | 11/1956 | Iles | 228/35 X |
| 2,918,028 | 12/1959 | Wright | 228/35 X |
| 3,006,318 | 10/1961 | Monroe, Jr. et al. | 118/202 X |

*Primary Examiner*—Walter A. Scheel
*Assistant Examiner*—Leon G. Machlin
*Attorney*—Beveridge & DeGrandi

ABSTRACT: Apparatus for applying solder to solderable substrates such as circuit boards includes a brushlike applicator. Molten solder is supplied to the brush and flows onto an article which is to be soldered. A bath of molten solder may be provided adjacent the end of the applicator so that both sides of a substrate may be soldered simultaneously.

PATENTED JUL 20 1971

3,593,677

INVENTOR
JOHN H. McLAIN

BY Browne, Schuyler & Beveridge

ATTORNEYS

SOLDERING APPARATUS AND METHOD

This invention relates to a soldering apparatus and a method of soldering which are particularly well suited for the application of solder to electrical circuit boards.

It is a common technique in the manufacture of electrical circuit boards to provide a dielectric base which is not wettable by molten solder with a circuit pattern which is capable of being wetted by a molten solder, and then to pass the base through a solder applying station where it is brought into contact with molten solder. Due to the properties of the dielectric base and the circuit pattern, the solder is transferred only to the electrically conductive circuit pattern on the board. This may be done to pretin the circuit board before electrical components are placed in the board or to connect leads from electrical components to the circuit pattern on a circuit board.

Various procedures such as printing, laminating or etching may be used to place circuit patterns on a circuit boards. One widely used technique commences with a dielectric base which has a coextensive layer of copper on either or both of its faces. An etch-resistant material is deposited on the surface of the copper clad laminate in the form of the desired circuit pattern. This may be done either by the widely used photoresist technique or by a silk screen printing process. Then, the laminate is exposed to an etchant which will remove all of the copper except the desired circuit pattern. The etch-resistant material is then removed, leaving the base with its copper surface in the configuration of the desired circuit pattern. The circuit board is then cleaned and a soldering flux is applied.

In the past, various techniques have been used for applying molten solder to a circuit board. A common technique involves the immersion of one surface of the circuit board in a bath of molten solder. The bath may simply comprise a vessel filled with molten solder, or it may be a constantly moving body of molten solder such as is provided by conventional wave soldering machines. Occasionally, a bath is supported on an inclined surface to produce a constant movement of the molten solder.

While the use of a solder bath in various forms has been widely accepted, it is limited to the application of solder to a single side of the circuit board. Complete immersion of both surfaces of a circuit board in a bath of solder is undesirable since the heat to which the circuit board is subjected will reduce the life of the circuit board and contribute to the delamination of the circuit pattern.

Efforts have been made to coat both sides of a circuit board by bringing the opposite sides of the board into contact with parallel metallic screens and introducing solder through the screens onto the board. This technique requires the circuit board to be extremely flat so that it will properly contact the parallel metallic screens. The requisite flatness is difficult to obtain when making circuit boards in accordance with the usual procedures described above.

Other methods of applying solder to the upper surface of a circuit board include the use of rollers or nozzles. Of course, the use of rollers also requires that the board be perfectly flat. The greatest difficulties with these techniques, however, are that it is necessary to apply an excessive amount of solder to the upper surface of the board and that there can be no accurate control of the temperature of the molten solder on the board. Excess solder may flow off the board and create spillage problems or it may form bridges between adjacent paths of the circuit pattern.

Briefly, this invention involves a method of applying solder to a substrate such as a circuit board by contacting the surface of the substrate with a solder-laden brush and causing movement of the brush across the substrate. The brush or other suitable solid applicator device which contacts the substrate is of a material capable of being wetted by the coating material so that there is a tendency for the solder to remain in the brush unless it is in direct contact with that portion of the circuit board or other substrate which may be wetted by the solder. In this manner and with the disclosed apparatus there will be no excessive flow of solder onto the circuit board.

The apparatus for carrying out the invention may involve a brush having heated bristles which will promote the flow of solder and maintain the solder at a proper temperature when it comes into contact with the circuit board. The invention may also be characterized as having a curtain of coating material, within which there are the bristles which form flexible guides for the curtain.

This invention also includes the method and apparatus resulting from the combination of a solid applicator such as a brush with a bath which act together to apply molten solder to the opposite sides of a substrate.

In keeping with the foregoing comments, a principal object of the invention is to provide an effective apparatus and method which is capable of applying solder to both sides of a substrate such as an electrical circuit board. The utilization of the invention assures that solder will be applied at a controlled temperature and in controlled amounts to prevent bridging between adjacent circuit paths and to prevent exposure of the board to excessive temperatures or temperature differentials which would lead to weakening of the board or any of its constituent parts.

Another object of the invention is to provide a method of applying solder to electrical circuit boards which permits control over the quantity or temperature of the solder by exposing the circuit boards to solder which is on a brush or a heated applicator.

The satisfaction of these and other objects is a result of this invention, a preferred form of which is shown in the appended drawings. Numerous variations of the illustrated embodiments are, of course, contemplated within the spirit of the invention.

Figures 1, 2, 4:
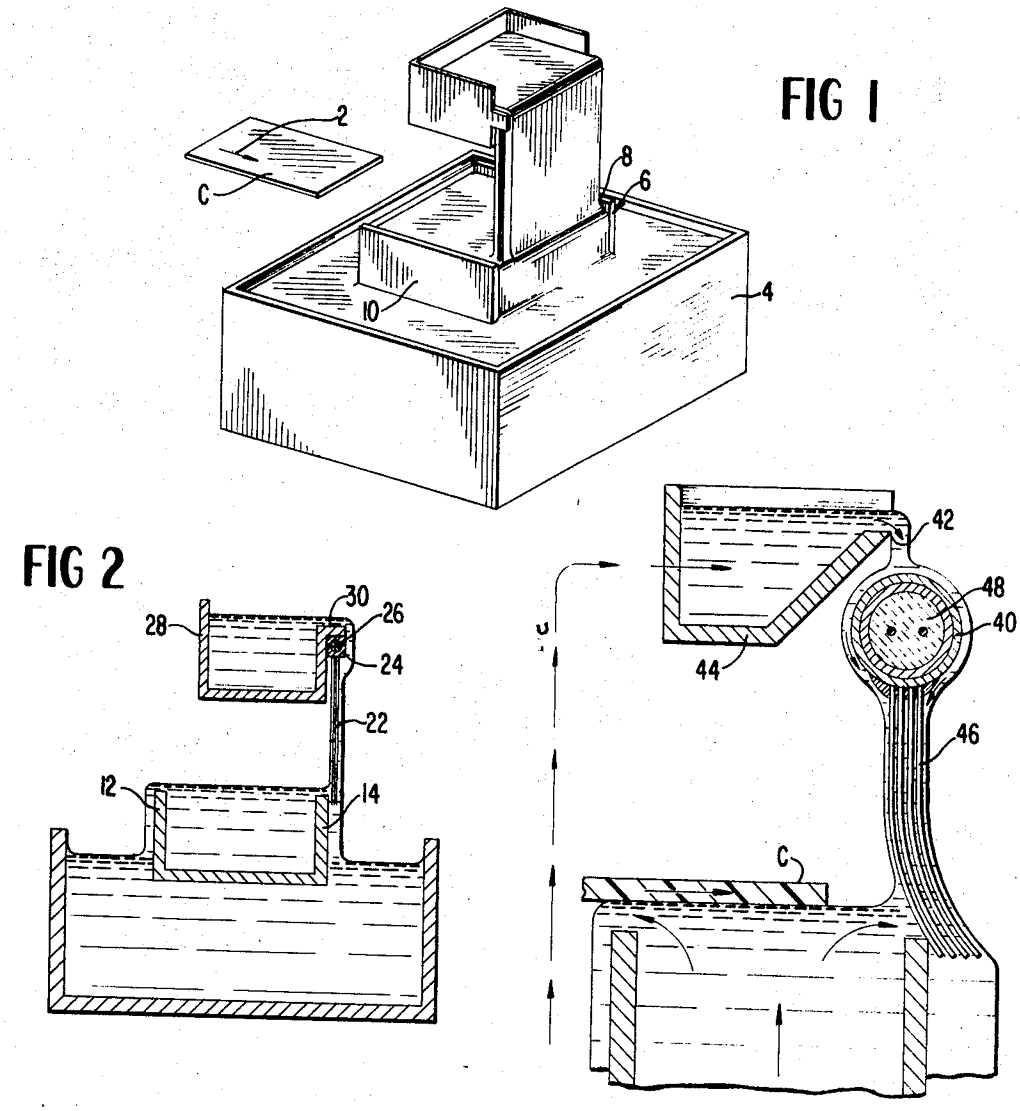
FIG. 1 is a perspective view showing the general arrangement of elements in the apparatus of the invention.
FIG. 2 is a longitudinal sectional view of the apparatus of FIG. 1.
FIG. 4 is a view of a modified form of apparatus constructed in accordance with this invention.
Figure 3:
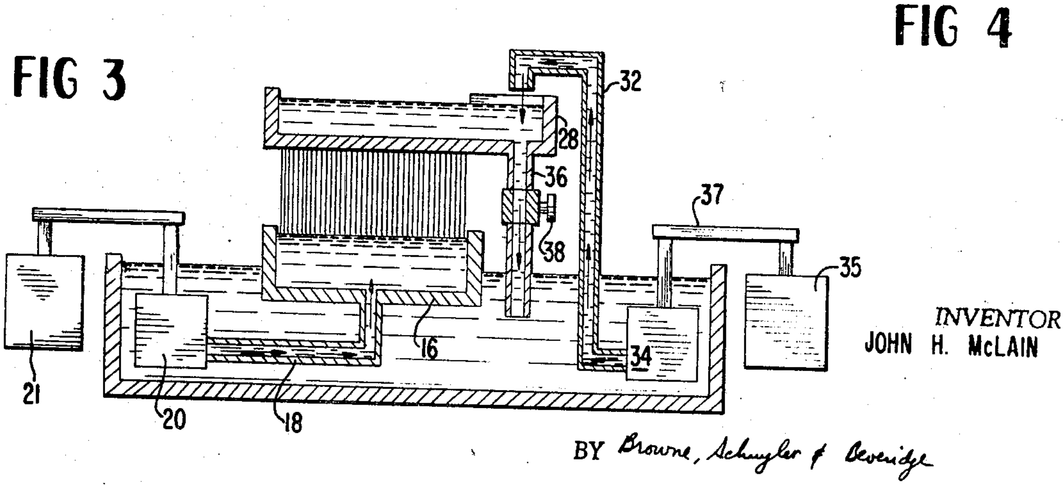
FIG. 3 is a transverse sectional view of the apparatus of FIG. 1 showing the pumps and conduits for controlling the flow of solder in the apparatus.

FIG. 1 shown a typical circuit board *C* which is moving in the direction of the arrow 2 toward the solder applying station constructed in accordance with the invention. At the soldering station there is a relatively large vessel 4 which contains molten solder. An upstanding wave soldering device 6 within the vessel 4 has a pair of longitudinally extending vertical sidewalls 8 and 10 and a pair of transversely extending vertical sidewalls 12 and 14 which are shown in FIG. 2. The sidewalls 8, 10, 12 and 14 together with the bottom wall 16 shown in FIG. 3 constitute an open-topped vessel which receives molten solder from a conduit 18 which is connected to the discharge end of a submerged pump 20. A motor 21 drives the pump 20. In a conventional manner, solder flows into the wave soldering device 6 and over the upper edges of walls 12 and 14 to form a laterally moving and descending wall of solder. The use of such a soldering device, since it provides a continuously moving stream of solder, prevents the formation and accumulation of impurities and dross in the solder bath.

The circuit board *C* which may be preheated is guided against or floated upon the surface of the solder at the wave soldering device 6 so that the lower surface of the circuit board will be coated in those areas of the circuit pattern which are wettable by the molten solder.

The upper surface of the circuit board is coated by molten solder introduced by a brushlike applicator which has a plurality of parallel bristles 22 extending downwardly from a base 24. The bristles may be flexible and resilient strands of metals such as steel or aluminum which are capable of being wetted by the molten solder when at their normal operating temperatures. A heating device 26 is located within the base and is in heat conducting relationship with the bristles 22 so that the bristles will remain at a controlled elevated temperature, preferably around 515° F., which will promote the flow of molten solder therealong. Alternatively, a single heating device may be used to maintain the solder in its molten condition in the vessel 28 and to heat the bristles 22.

The solder supplied to the bristles 22 first passes over the lip 30 of the vessel 28 and downwardly onto the bristles in the manner shown in FIG. 2. Since the bristles are of a material which is capable of being wetted by the solder, there will be a tendency for the solder to remain on the bristles as they contact those portions of a circuit board which are not capable of being wetted by the solder. The introduction of excessive amounts of solder to the bristles 22 is avoided by controlling the amount of molten solder which flows over the lip 30 of the vessel 28. This is done by the arrangement illustrated in FIG. 3 where the vessel 28 is shown receiving the molten solder from a conduit 32 which is connected to the discharge end of a pump 34. A motor 35 acts through a belt 37 to drive the pump 34. A recirculating conduit 36 which has a valve 38 extends downwardly from the vessel 28 to control the dumping of molten solder into the main vessel 4. With this arrangement, the discharge rate of the pump 34 may remain constant, and the amount of solder discharged onto the bristles 22 may be varied by adjusting the setting of the valve 38.

As shown in FIG. 2 the lower ends of the bristles 22 are in contact with the solder at the wave soldering device 6. This, too, prevents the accumulation of excessive amounts of solder on the bristles 22 by permitting the solder to flow downwardly on the bristles 22 and directly into the bath of solder therebelow when no circuit boards are being passed through the apparatus.

An alternative construction of the brush member is illustrated in FIG. 4 where the base 40 of the brush is spaced below the lip 42 of the solder-supplying vessel 44. The location of the lip 42 causes the solder to flow downwardly along the opposite sides of the base 40 and onto the bristles 46. As in the embodiment shown in FIGS. 1—3 a heating device 38 is located within the base 40. Due to the heat conductive attachment of the bristles 46 to the base 40, the heating device 48 maintains the bristles at a controlled temperature.

Numerous modifications to the disclosed embodiments are within the spirit of this invention. When relatively small circuit boards are soldered, it may be possible to dispense with the solder supply in vessel 28 at the upper end of the brush, so that the brush will receive its solder from the bath at the wave soldering device 6 due to its immersion therein and the principle of capillary attraction. In some situations, the bath of molten solder may be eliminated and the brushes or other applicators may be arranged either to coat a single side of a substrate or to coat both sides of a vertically moving substrate. A brush may be used simply to unite two or more solderable members.

The illustrated apparatus is only demonstrative of one form of the invention and does not include the many well-known adjuncts which may be employed with this apparatus such as a guide channel for the circuit boards or a conveyor for moving a circuit board through the coating station. Other variations of and modifications to this invention will naturally result from the development of this phase of the art. Accordingly, any such modifications or variations within the spirit of the invention are encompassed by the claims which follow:

What I claim is:

1. Apparatus for applying solder to a substrate comprising a brush having a base and a plurality of bristles which extend downwardly from the base and are capable of being wetted by a coating material which is at a given temperature, a heating device mounted on the base to maintain the bristles at said given temperature, means for supplying molten solder to the bristles, and means providing a bath of molten solder at least proximate to the lower end of the bristles; whereby a substrate moving along the bristles will have one surface coated by solder from the bath and another surface coated by solder from the bristles.

2. Apparatus according to claim 1 wherein the bristles are below the base and in which the means for supplying molten solder includes means for flowing a stream of molten solder downwardly from the base of the brush onto the bristles.

3. Apparatus according to claim 1 wherein the bath of coating material is in contact with the lower ends of the bristles; whereby coating material may flow from the bristles directly into the bath when a substrate is not located between the bath and the bristles.

4. Apparatus for applying solder to a substrate having upper and lower surfaces comprising an applicator located in a position to contact said upper surface of said substrate, means located below the applicator for providing a liquid bath of solder for contacting the lower surface of said substrate, the solid applicator having its portion which contacts the upper surface of the substrate movable upwardly from an initial position where it is at least proximate to and in vertical alignment with the liquid bath.

5. Apparatus according to claim 4 in which the applicator is a brush which has a plurality of bristles which contact said substrate.

6. Apparatus according to claim 5 having a heating device located and arranged to heat the bristles of the brush.

7. Apparatus according to claim 4 having a heating device located and arranged to heat the applicator.

8. Apparatus according to claim 7 in which the solid applicator has its said portion in contact with the liquid bath.

9. Solder applying apparatus comprising means for generating a curtain of molten solder which flows downwardly under the influence of gravity through a soldering station where an article may be located, a flexible guide which is substantially coextensive with the curtain and is capable of being wetted by the solder located within the curtain and extending downwardly to the soldering station, said guide being located in the path of articles passing through said soldering station, and means for providing a bath of molten solder at the soldering station for applying solder to the lower surface of an article located at the soldering station.

10. Apparatus according to claim 9 in which the flexible guide comprises a plurality of bristles.

11. Apparatus according to claim 10 having means for heating the flexible guide.

12. Apparatus according to claim 9 having means for heating the flexible guide.